United States Patent
Nam et al.

(10) Patent No.: US 9,553,134 B2
(45) Date of Patent: Jan. 24, 2017

(54) DISPLAY DEVICE

(71) Applicant: SAMSUNG DISPLAY CO., LTD., Yongin, Gyeonggi-do (KR)

(72) Inventors: Hui Nam, Yongin-si (KR); Jong-Seo Lee, Yongin-si (KR); Beom Shik Kim, Yongin-si (KR); Joon Hak Oh, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/472,346

(22) Filed: Aug. 28, 2014

(65) Prior Publication Data
US 2015/0205418 A1 Jul. 23, 2015

(30) Foreign Application Priority Data
Jan. 22, 2014 (KR) ........................ 10-2014-0007951

(51) Int. Cl.
*G06F 3/047* (2006.01)
*H01L 27/32* (2006.01)
(Continued)

(52) U.S. Cl.
CPC ............. *H01L 27/323* (2013.01); *G06F 3/044* (2013.01); *G06F 3/0412* (2013.01); *G06F 2203/04107* (2013.01)

(58) Field of Classification Search
CPC ............. H01L 51/5243; H01L 51/5246; H01L 27/323; G02F 1/13338; G02F 1/1339; G02F 1/134309; G02F 1/136213; G02F 1/1368; G06F 3/0412; G06F 3/044; G06F 2203/04107
(Continued)

(56) References Cited

U.S. PATENT DOCUMENTS

| 2005/0040762 A1* | 2/2005 | Kurihara ............. H01L 51/5237 313/512 |
| 2008/0129664 A1* | 6/2008 | Lin ..................... H01L 27/1288 345/87 |

(Continued)

FOREIGN PATENT DOCUMENTS

| JP | 2003-099193 A | 4/2003 |
| KR | 10-2008-0080912 A | 9/2008 |

(Continued)

*Primary Examiner* — Amare Mengistu
*Assistant Examiner* — Stacy Khoo
(74) *Attorney, Agent, or Firm* — Lewis Roca Rothgerber Christie LLP

(57) ABSTRACT

Provided is a display device, including: a first substrate including a display area and a non-display area adjacent to the display area; a display unit on the first substrate at the display area and configured to display an image; a display wiring on the first substrate at the non-display area and coupled to the display unit; a second substrate on the first substrate with the display unit and the display wiring therebetween; a touch unit on the second substrate, corresponding to the display unit, and configured to recognize a touch; a touch wiring on the second substrate at the non-display area and coupled to the touch unit; and an anti-noise electrode between the display wiring and the touch wiring at the non-display area.

12 Claims, 6 Drawing Sheets

(51) Int. Cl.
*G06F 3/044* (2006.01)
*G06F 3/041* (2006.01)

(58) Field of Classification Search
USPC .............. 345/87, 173–179; 178/18.01–18.09
See application file for complete search history.

(56) References Cited

U.S. PATENT DOCUMENTS

| | | | | |
|---|---|---|---|---|
| 2008/0265785 | A1* | 10/2008 | Kim | G09G 3/3225 315/169.3 |
| 2009/0026932 | A1* | 1/2009 | Kwak | H01L 27/3276 313/504 |
| 2009/0278443 | A1* | 11/2009 | Terada | H01L 51/5237 313/504 |
| 2010/0085326 | A1* | 4/2010 | Anno | G06F 3/044 345/174 |
| 2012/0075237 | A1* | 3/2012 | Ikeda | G06F 3/044 345/174 |
| 2013/0300680 | A1* | 11/2013 | Kim | H01L 27/323 345/173 |
| 2014/0167009 | A1* | 6/2014 | Lee | H01L 27/3272 257/40 |

FOREIGN PATENT DOCUMENTS

KR        10-1084426 B1     11/2011
KR    10-2012-0032158 A      4/2012

* cited by examiner

DISPLAY DEVICE

CROSS-REFERENCE TO RELATED APPLICATION

This application claims priority to and the benefit of Korean Patent Application No. 10-2014-0007951 filed in the Korean Intellectual Property Office on Jan. 22, 2014, the entire contents of which are incorporated herein by reference.

BACKGROUND

1. Field

Aspects of embodiments of the present invention relate to a display device, and more particularly, to a display device including a touch unit for recognizing a touch.

2. Description of the Related Art

In general, representative examples of a flat panel display include an organic light emitting display, a liquid crystal display, a plasma display panel, and the like.

Recently, the display device includes a display unit for displaying an image, a display wiring for transmitting a driving signal to the display unit, a touch unit positioned on the display unit, and a touch wiring for transmitting a touch recognition signal to the touch unit.

However, in the aforementioned display device, there is a problem in that undesired noise is generated in each signal through each of the display wiring and the touch wiring by the signal through each of the display wiring and the touch wiring at a portion where the display wiring and the touch wiring overlap with each other.

The above information disclosed in this Background section is only for enhancement of understanding of the background of the invention and therefore it may contain information that does not form the prior art that is already known to a person of ordinary skill in the art.

SUMMARY

According to example embodiments of the present invention, a display device has features of suppressing noise from being generated or reducing noise in each signal through a display wiring and a touch wiring, even though the display wiring and the touch wiring overlap or cross with each other.

An example embodiment of the present invention provides a display device, including: a first substrate including a display area and a non-display area adjacent to the display area; a display unit on the first substrate at the display area and configured to display an image; a display wiring on the first substrate at the non-display area and coupled to the display unit; a second substrate on the first substrate with the display unit and the display wiring therebetween; a touch unit on the second substrate, corresponding to the display unit, and configured to recognize a touch; a touch wiring on the second substrate at the non-display area and coupled to the touch unit; and an anti-noise electrode between the display wiring and the touch wiring at the non-display area.

Fixed power may be applied to the anti-noise electrode.

The display unit may include: an organic light emitting diode including a first electrode on the first substrate; an organic emission layer on the first electrode; and a second electrode on the organic emission layer.

The anti-noise electrode may be at a same layer as the second electrode and may be formed of a same material as that of the second electrode.

The second electrode may include a light transmissive electrode.

The anti-noise electrode may be coupled to the second electrode.

The anti-noise electrode may be extended from and is integral to the second electrode.

The display device may further include a sealant between the first substrate and the second substrate to correspond to the non-display area and configured to cover the display unit, wherein the anti-noise electrode may include a connection portion coupled to the second electrode by contacting the sealant and having a smaller width than that of the other portions of the anti-noise electrode.

The anti-noise electrode may be spaced from the second electrode.

The anti-noise electrode may be at a same layer as the first electrode and may be formed of a same material as that of the first electrode.

The anti-noise electrode may be spaced from the first electrode.

The display unit may further include a thin film transistor coupled to the organic light emitting diode, the thin film transistor may include: an active layer on the first substrate; a gate electrode on the active layer; and source and drain electrodes on the gate electrode and coupled to the active layer.

The display wiring may be at a same layer as the gate electrode and may be formed of a same material as that of the gate electrode, and the anti-noise electrode may be at a same layer as the source and drain electrodes and may be formed of a same material as that of the source and drain electrodes.

The touch unit may be a capacitive type touch unit.

The display device may further include a driver on the first substrate corresponding to the non-display area and coupled to the display wiring.

According to example embodiments of the present invention, it is possible to suppress noise from being generated or reduce noise in each signal through a display wiring and a touch wiring, even though the display wiring and the touch wiring overlap or cross with each other.

DETAILED DESCRIPTION

Figure 1:
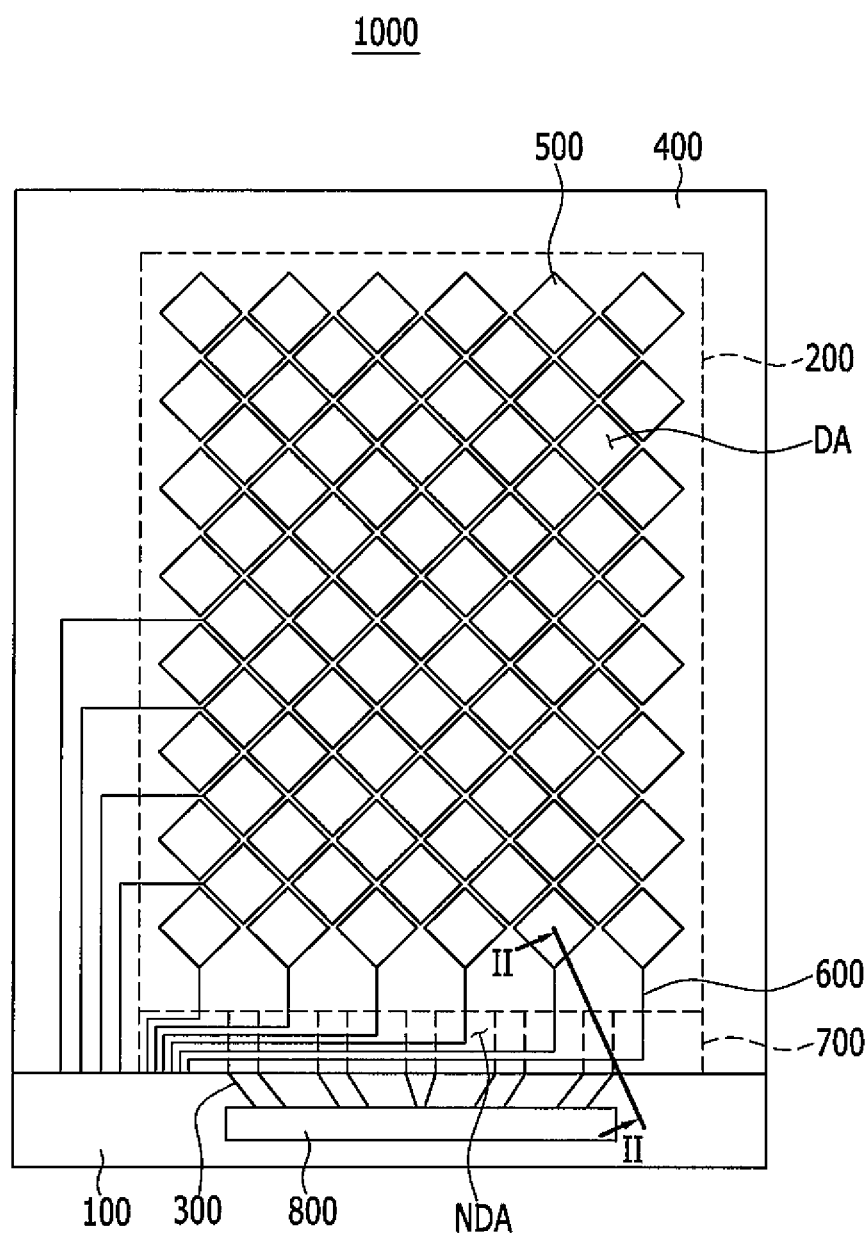
FIG. 1 is a plan view illustrating a display device according to an example embodiment of the present invention.

The present invention will be described more fully hereinafter with reference to the accompanying drawings, in which example embodiments of the present invention are shown. As those skilled in the art would realize, the described embodiments may be modified in various different ways, all without departing from the spirit or scope of the present invention.

The drawings and description are to be regarded as illustrative in nature and not restrictive, and like reference numerals designate like elements throughout the specification.

Further, in the example embodiments, since like reference numerals designate like elements having the same configuration, a first example embodiment is representatively described, and in other example embodiments, only a configuration different from the first example embodiment may be described.

Further, in the drawings, size and thickness of each element may be arbitrarily illustrated for convenience of illustration, and the present invention is not necessarily limited to those illustrated in the drawings.

In the drawings, the thickness of layers, films, panels, regions, etc., may be exaggerated for clarity. In the drawings, the thicknesses of a layer and a region may be exaggerated for convenience of illustration. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. Further, in the specification, the word "on" means positioning on or below the object portion, but does not necessarily mean positioning on the upper side of the object portion based on a gravity direction.

Hereinafter, an organic light emitting display including an organic light emitting diode will be described as an example for a display device, but a display device according to other example embodiments of the present invention may be various display devices such as liquid crystal displays (LCDs), plasma displays (PDs), field emission displays (FEDs), electrophoretic displays (EPDs), and electrowetting displays (EWDs) when including a display unit displaying an image and a touch unit recognizing a touch.

Hereinafter, a display device according to an example embodiment of the present invention will be described with reference to FIGS. 1 and 2.

FIG. 1 is a plan view illustrating a display device according to an example embodiment of the present invention. FIG. 2 is a cross-sectional view taken along the line II-II of FIG. 1.

Figure 2:
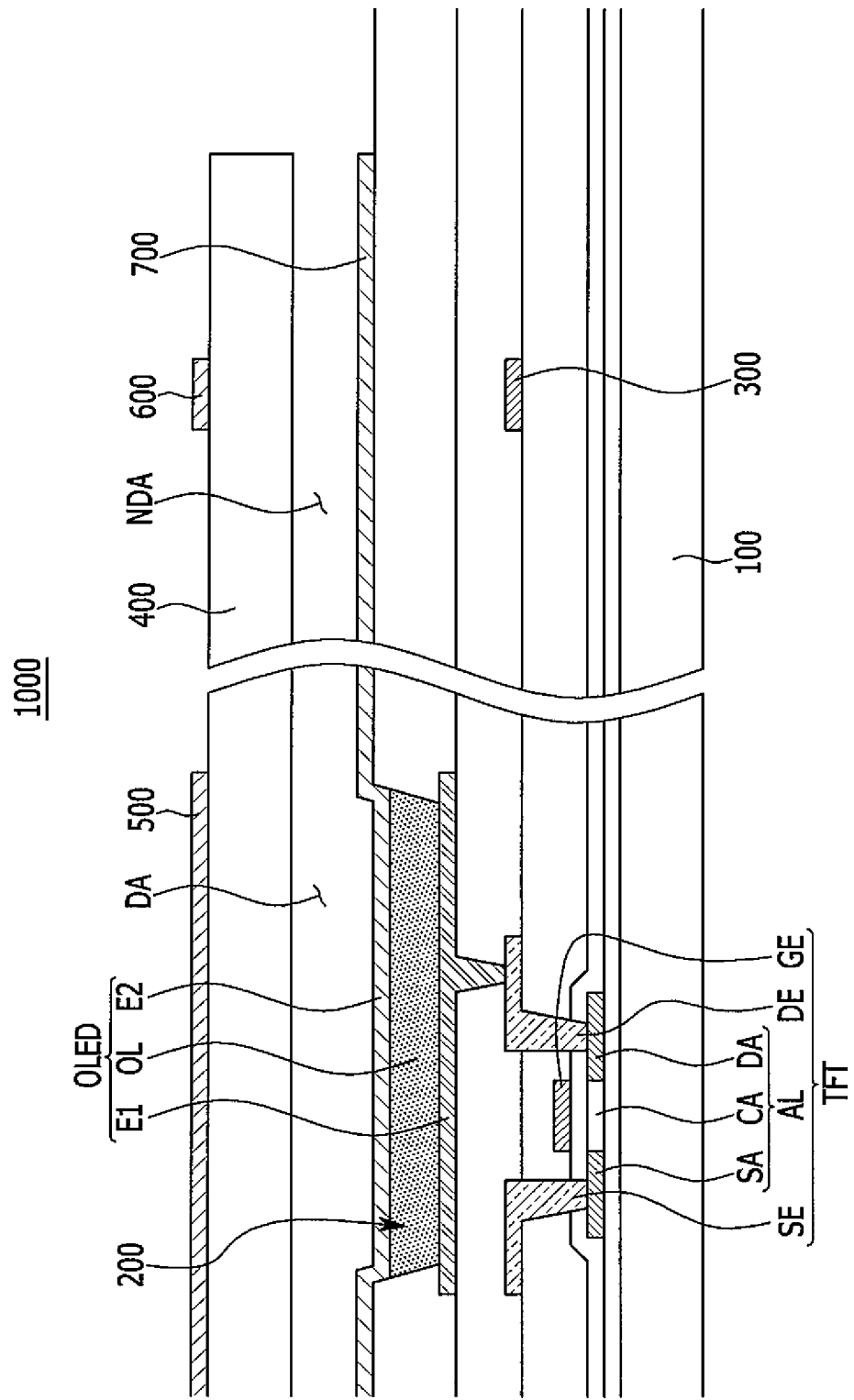
FIG. 2 is a cross-sectional view taken along the line II-II of FIG. 1.

As illustrated in FIGS. 1 and 2, a display device 1000 according to an example embodiment of the present invention includes a first substrate 100, a display unit 200, a display wiring 300, a second substrate 400, a touch unit 500, a touch wiring 600, an anti-noise electrode 700, and a driver 800.

The first substrate 100 is formed as a transparent insulating substrate made of glass, quartz, ceramics, plastic, or the like. However, example embodiments of the present invention are not limited thereto, and the first substrate 100 may be formed as a metallic substrate made of stainless steel or the like. Further, in the case where the first substrate 100 is made of plastic or the like, the display device 1000 may have a flexible characteristic, and a stretchable or rollable characteristic. The first substrate 100 faces the second substrate 400 with the display unit 200 therebetween. The first substrate 100 is attached to the second substrate 400 by a sealant such as a frit, for example, to seal a space in which the display unit 200 is positioned, together with the sealant and the second substrate 400. The first substrate 100 includes a display area DA in which an image is displayed, and a non-display area NDA adjacent to the display area DA. In the example embodiments of the present invention, the display area DA is positioned at a central area of the first substrate 100, and the non-display area NDA is positioned at an outer area of the first substrate 100. However the positions of the display area DA and non-display area NDA are not limited thereto, and as long as the display area DA and the non-display area NDA are adjacent to each other, the display area DA and the non-display area NDA may be positioned at any area of the first substrate 100.

The display unit 200 is positioned on the first substrate 100 to correspond to the display area DA, and displays an image. The display unit 200 includes a circuit portion including a thin film transistor TFT, and an organic light emitting diode OLED.

The thin film transistor TFT is positioned between the organic light emitting diode OLED and the first substrate 100. The thin film transistor TFT includes an active layer AL positioned on the first substrate 100 and including a channel area CA, a source area SA, and a drain area DA. The thin film transistor TFT further includes a gate electrode GE positioned on the channel area CA of the active layer AL, and source and drain electrodes SE and DE positioned on the gate electrode GE and respectively coupled to (e.g., connected to) the source area SA and the drain area DA of the active layer AL. The thin film transistor TFT may be one thin film transistor of a plurality of thin film transistors included in the circuit portion, and the circuit portion includes the plurality of thin film transistors and one or more capacitors. The circuit portion may be configured in various known forms capable of driving the organic light emitting diode OLED.

Further, the active layer AL is a semiconductor layer, and the semiconductor layer may be formed of polysilicon or an oxide semiconductor. The oxide semiconductor may include one of oxide based on titanium (Ti), hafnium (Hf), zirconium (Zr), aluminum (Al), tantalum (Ta), germanium (Ge), zinc (Zn), gallium (Ga), tin (Sn) or indium (In), zinc oxide (ZnO), indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O), which are complex oxides thereof. The active layer AL includes the channel area CA in which an impurity is not doped, and the source area SA and the drain area DA in which impurities are doped. The source area SA and the drain area DA are at respective sides of the channel area CA. Herein, the impurities vary according to a kind of thin film transistor, and may be N-type impurities or P-type impurities. In the case where the active layer AL is formed of the oxide semiconductor, a separate passivation layer may be included in order to protect the oxide semiconductor which may be vulnerable to an external environment such as exposure to a high temperature.

In the example embodiments of the present invention, the thin film transistor TFT is a top gate thin film transistor, but the thin film transistor TFT is not limited thereto, and in another example embodiment of the present invention, the thin film transistor TFT may be a bottom gate thin film transistor.

The organic light emitting diode OLED includes a first electrode E1 positioned on the first substrate 100 and coupled to the thin film transistor TFT, an organic emission layer OL positioned on the first electrode E1, and a second electrode E2 positioned on the organic emission layer OL.

The first electrode E1 receives a driving power from the driver 800 through the circuit portion. The second electrode E2 is positioned throughout the first substrate 100, and receives a fixed power from the driver 800 or from the outside.

Each of the first electrode E1 and the second electrode E2 may be formed as a light transmissive electrode or a light reflective electrode. For example, the first electrode E1 may be formed as the light reflective electrode, and the second electrode E2 may be formed as the light transmissive electrode. In this case, light is emitted from the organic emission layer OL through the second electrode E2 to the outside of the display device.

The organic emission layer OL is positioned between the first electrode E1 and the second electrode E2. The organic emission layer OL emits light with luminance corresponding to (e.g., according to) a driving current flowing in the organic emission layer OL, when the driving power is supplied to the first electrode E1 through the circuit portion from the driver 800, and the fixed power is supplied to the second electrode E2. The organic emission layer OL of the organic light emitting diode OLED may be formed of a low-molecular organic material or a high-molecular organic material such as poly 3,4-ethylenedioxythiophene (PEDOT). Further, the organic emission layer OL may be formed as a multilayer including an emission layer, and one or more of a hole injection layer (HIL), a hole transporting layer (HTL), an electron transporting layer (ETL), and an electron injection layer (EIL). In the case where the organic emission layer OL includes all of the above layers, the hole injection layer (HIL) is formed on the first electrode E1 which is an anode, and the hole transporting layer (HTL), the emission layer, the electron transporting layer (ETL), and the electron injection layer (EIL) are sequentially laminated on the hole injection layer (HIL). The organic emission layer OL may include a red organic emission layer for emitting red light, a green organic emission layer for emitting green light, or a blue organic emission layer for emitting blue light. The red organic emission layer, the green organic emission layer, and the blue organic emission layer are formed in a red pixel, a green pixel, and a blue pixel, respectively, thereby implementing a color image. Further, the organic emission layer OL may implement a color image by laminating the red organic emission layer, the green organic emission layer, and the blue organic emission layer together in the red pixel, the green pixel, and the blue pixel, and forming a red color filter, a green color filter, and a blue color filter for each pixel. As another example, white organic emission layers for emitting white light are formed in each of the red pixel, the green pixel, and the blue pixel, and a red color filter, a green color filter, or a blue color filter is formed for each pixel, thereby implementing a color image. In the case where a color image is implemented by using the white organic emission layer and the color filter, since it is not necessary to use a deposition mask for forming each of the red organic emission layer, the green organic emission layer, and the blue organic emission layer, it may be suitable to improve resolution.

The display wiring 300 is positioned on the first substrate 100 to correspond to the non-display area NDA. The display wiring 300 is coupled to (e.g., connected to) the display unit 200 and the driver 800, and couples (e.g., connects) the display unit 200 to the driver 800. The display wiring 300 is positioned at the same layer as the source and drain electrodes SE and DE, and may be made of the same material or substantially the same material as the source and drain electrodes SE and DE. The display wiring 300 may be formed concurrently (e.g., simultaneously) with the source and drain electrodes SE and DE by one process forming the source and drain electrodes SE and DE. The driving power supplied from the driver 800 is supplied to the display unit 200 through the display wiring 300.

In one example embodiment of the present invention, the display wiring 300 is positioned at the same layer as the source and drain electrodes SE and DE and is formed of the same material or substantially the same material as the source and drain electrodes SE and DE. However, example embodiments of the present invention are not limited thereto, and in another example embodiment of the present invention, the display wiring 300 may be positioned at the same layer as the gate electrode GE or the active layer AL, and may be formed of the same material or substantially the same material as the gate electrode GE or the active layer AL.

The second substrate 400 is positioned on the first substrate 100 with the display unit 200 and the display wiring 300 located therebetween. The second substrate 400 is formed as a transparent insulating substrate made of glass, quartz, ceramics, plastic, or the like. However, the example embodiments of the present invention are not limited thereto, and the second substrate 400 may be formed as a metallic substrate made of stainless steel or the like. Further, in the case where the second substrate 400 is made of plastic or the like, the display device 1000 may have a flexible characteristic, and a stretchable or rollable characteristic. The second substrate 400 faces the first substrate 100 with the display unit 200 therebetween. The second substrate 400 is attached to the first substrate 100 by a sealant such as a frit to seal a space in which the display unit 200 is positioned, together with the sealant and the first substrate 100. The second substrate 400 has an area (e.g., surface area) smaller than that of the first substrate 100, and since the second substrate 400 has an area smaller than that of the first substrate 100, the non-display area NDA of the first substrate 100 where the driver 800 is positioned is exposed.

In the example embodiments of the present invention, the second substrate 400 is formed as one insulating substrate, but in another example embodiment of the present invention, the second substrate 400 may be formed as a thin film encapsulation layer. The thin film encapsulation layer may be formed by alternately laminating at least one organic layer and at least one inorganic layer. The organic layer is made of a polymer, and may be a single layer of a laminated layer formed by any one of polyethylene terephthalate, polyimide, polycarbonate, epoxy, polyethylene, and polyacrylate. Alternatively, the organic layer may be formed by polyacrylate, and in detail, includes a material in which a monomer composition including diacrylate-based monomers and triacrylate-based monomers is polymerized.

Monoacrylate-based monomers may be further included in the monomer composition. Further, in the monomer composition, a known photo-initiator such as TPO may be further included, but embodiments of the present invention are not limited thereto. The inorganic layer may be a single layer or a laminated layer including metal oxide or metal nitride. In detail, the inorganic layer may include any one of $SiN_x$, $Al_2O_3$, $SiO_2$, and $TiO_2$. A top layer exposed to the outside in the encapsulation layer may be formed as an inorganic layer in order to prevent or substantially prevent moisture from being penetrated into the organic light emitting diode. The thin film encapsulation layer may include at least one sandwich structure in which at least one organic layer is located between at least two inorganic layers. Further, the thin film encapsulation layer may include at least one sandwich structure in which at least one inorganic layer is located between at least two organic layers. The thin film encapsulation layer may include a first inorganic layer, a first organic layer, and a second inorganic layer in sequence from the top of the display unit 200. Further, the thin film encapsulation layer may include a first inorganic layer, a first organic layer, a second inorganic layer, a second organic layer, and a third inorganic layer in sequence from the top of the display unit 200. Further, the thin film encapsulation layer may include a first inorganic layer, a first organic layer, a second inorganic layer, a second organic layer, a third inorganic layer, a third organic layer, and a fourth inorganic layer in sequence from the top of the display unit 200. A halogenated metal layer including LiF may be additionally located between the display unit 200 and the first inorganic layer. The halogenated metal layer may prevent or substantially prevent the display unit 200 from being damaged when the first inorganic layer is formed by a sputtering method or a plasma deposition method. An area (e.g., surface area) of the first organic layer of the thin film encapsulation layer may be smaller than that of the second inorganic layer, and an area of the second organic layer may be smaller than that of the third inorganic layer. Further, the first organic layer may be fully or substantially covered by the second inorganic layer, and the second organic layer may be fully or substantially covered by the third inorganic layer.

The touch unit 500 is positioned on the second substrate 400 corresponding to the display unit 200, and recognizes a touch. The touch unit 500 includes a plurality of touch pads which insulatively cross each other, and is formed by a capacitive type. In the example embodiments of the present invention, the touch unit 500 includes rhombus-shaped touch pads, but in another example embodiment of the present invention, the touch unit 500 may have various known forms capable of recognizing a touch. The touch unit 500 includes a light transmissive conductive material such as indium-tin oxide or indium-zinc oxide.

The touch wiring 600 is positioned on the second substrate 400 to correspond to the non-display area NDA, and is coupled to the touch unit 500. The touch wiring 600 transmits a touch signal to the touch unit 500, and/or receives a touch sensing signal from the touch unit 500. The touch wiring 600 is coupled to a flexible printed circuit board (FPCB), and the like, to receive the touch signal from the outside and/or to transmit the touch sensing signal to the outside. The touch wiring 600 is positioned on the second substrate 400 to correspond to the non-display area NDA, and overlaps with (e.g., cross) the display wiring 300. In detail, the touch wiring 600 and the display wiring 300 positioned in the non-display area NDA positioned between the display unit 200 and the driver 800 overlap with each other. The touch wiring 600 includes a light transmissive conductive material such as indium tin oxide or indium zinc oxide, or a metal such as copper (Cu) and aluminum (Al).

The anti-noise electrode 700 is positioned between the display wiring 300 and the touch wiring 600 corresponding to the non-display area NDA. The fixed power is applied to the anti-noise electrode 700. The fixed power having a fixed voltage is applied to the anti-noise electrode 700 in order to suppress undesired noise from being generated in each of the driving power through the display wiring 300, and the touch signal through the touch wiring 600. For example, when the anti-noise electrode 700 is not located between the display wiring 300 and the touch wiring 600, the undesired noise may be generated in the driving power through the display wiring 300 by the touch signal through the touch wiring 600 at a position where the display wiring 300 and the touch wiring 600 overlap with (e.g., cross) each other. Further, the undesired noise may be generated in the touch signal through the touch wiring 600 by the driving power through the display wiring 300 at a position where the display wiring 300 and the touch wiring 600 overlap with each other. However, in the display device 1000 according to one example embodiment of the present invention, the anti-noise electrode 700 to which the fixed power is applied is positioned between the display wiring 300 and the touch wiring 600 corresponding to the non-display area NDA where the display wiring 300 and the touch wiring 600 overlap with each other. Thus, the anti-noise electrode 700 suppresses or reduces the undesired noise from being generated in each of the driving power through the display wiring 300, and the touch signal through the touch wiring 600.

The anti-noise electrode 700 is positioned at the same layer as the second electrode E2, and is formed of the same material or substantially the same material as the second electrode E2. That is, the anti-noise electrode 700 is coupled to the second electrode E2, and the same fixed power as the fixed power through the second electrode E2 is applied to the anti-noise electrode 700. The anti-noise electrode 700 is extended from the second electrode E2 in one plate shape (e.g., is extended from and is integral to the second electrode E2).

In one example embodiment of the present invention, the anti-noise electrode 700 is formed at the same layer as the second electrode E2, but embodiments of the present invention are not limited thereto, and in another example embodiment of the present invention, the anti-noise electrode 700 may be formed on a rear surface of the second substrate 400 or the first substrate 100 as an additional layer.

As described above, the anti-noise electrode 700 is coupled to the second electrode E2 to have one plate shape (e.g., is extended from and is integral to the second electrode E2), such that the anti-noise electrode 700 is formed during the process of forming the second electrode E2, instead of an additional process. As a result, even though the display device 1000 includes the anti-noise electrode 700, the display device 1000, which suppresses additional manufacturing time and manufacturing cost from being generated, is provided.

The driver 800 is positioned on the first substrate 100 corresponding to the non-display area NDA, which does not overlap with the second substrate 400. The driver 800 is coupled to the display wiring 300 to supply the driving power to the display unit 200 through the display wiring 300. The driver 800 may be formed on the first substrate 100 by using a process such as chip on glass (COG). The driver 800 is coupled to an external printed circuit board (PCB) by using the flexible printed circuit board (FPCB), and the like, to receive the driving power from the outside.

As described above, in the display device 1000 according to example embodiments of the present invention, the anti-noise electrode 700 to which the fixed power is applied is positioned between the display wiring 300 and the touch wiring 600 corresponding to the non-display area NDA where the display wiring 300 and the touch wiring 600 overlap with (e.g., cross) each other. Thus, the anti-noise electrode 700 may suppress or reduce the undesired noise from being generated in each of the driving power through the display wiring 300, and the touch signal through the touch wiring 600. That is, the display device 1000 with significantly or substantially improved driving reliability may be provided.

Further, in the display device 1000 according to one example embodiment of the present invention, the anti-noise electrode 700 is coupled to (e.g., connected to) the second electrode E2 to have one plate shape (e.g., is extended from and is integral to the second electrode E2), such that the anti-noise electrode 700 is additionally formed during the process of forming the second electrode E2, instead of an additional process. As a result, even though the display device 1000 includes the anti-noise electrode 700, the display device 1000, which suppresses additional manufacturing time and manufacturing cost from being generated, is provided.

Hereinafter, a display device according to another example embodiment of the present invention will be described with reference to FIG. 3.

Figure 3:
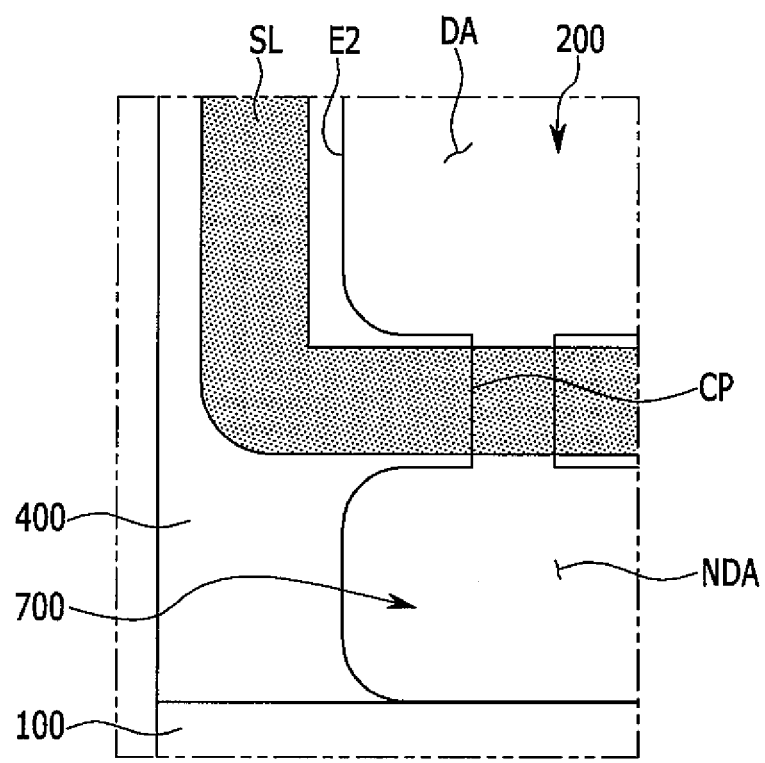
FIG. 3 is a plan view illustrating a part of a display device according to another example embodiment of the present invention.

FIG. 3 is a plan view illustrating a part of a display device according to another example embodiment of the present invention. FIG. 3 illustrates only the main constituent elements in a part of the display device according to another example embodiment of the present invention for the convenience of illustration.

As illustrated in FIG. 3, a display device 1000 according to another example embodiment of the present invention includes a sealant SL positioned between the first substrate 100 and the second substrate 400 to correspond to the non-display area NDA and covering the display unit 200.

The anti-noise electrode 700 includes a connection portion CP coupled to the second electrode E2 by contacting the sealant SL. The connection portion CP has a smaller width than that of the other portions of the anti-noise electrode 700.

As described above, in the display device 1000 according to the example embodiments of the present invention, since the anti-noise electrode 700 includes the connection portion CP contacting the sealant SL and having a smaller width than that of the other portions of the anti-noise electrode 700, even though the anti-noise electrode 700 is extended from the second electrode E2, adhesion between the sealant SL and the first substrate 100 is suppressed from deteriorating by the anti-noise electrode 700, because only the connection portion CP having a smaller width contacts the sealant SL.

Hereinafter, a display device according to another example embodiment of the present invention will be described with reference to FIG. 4.

Figure 4:
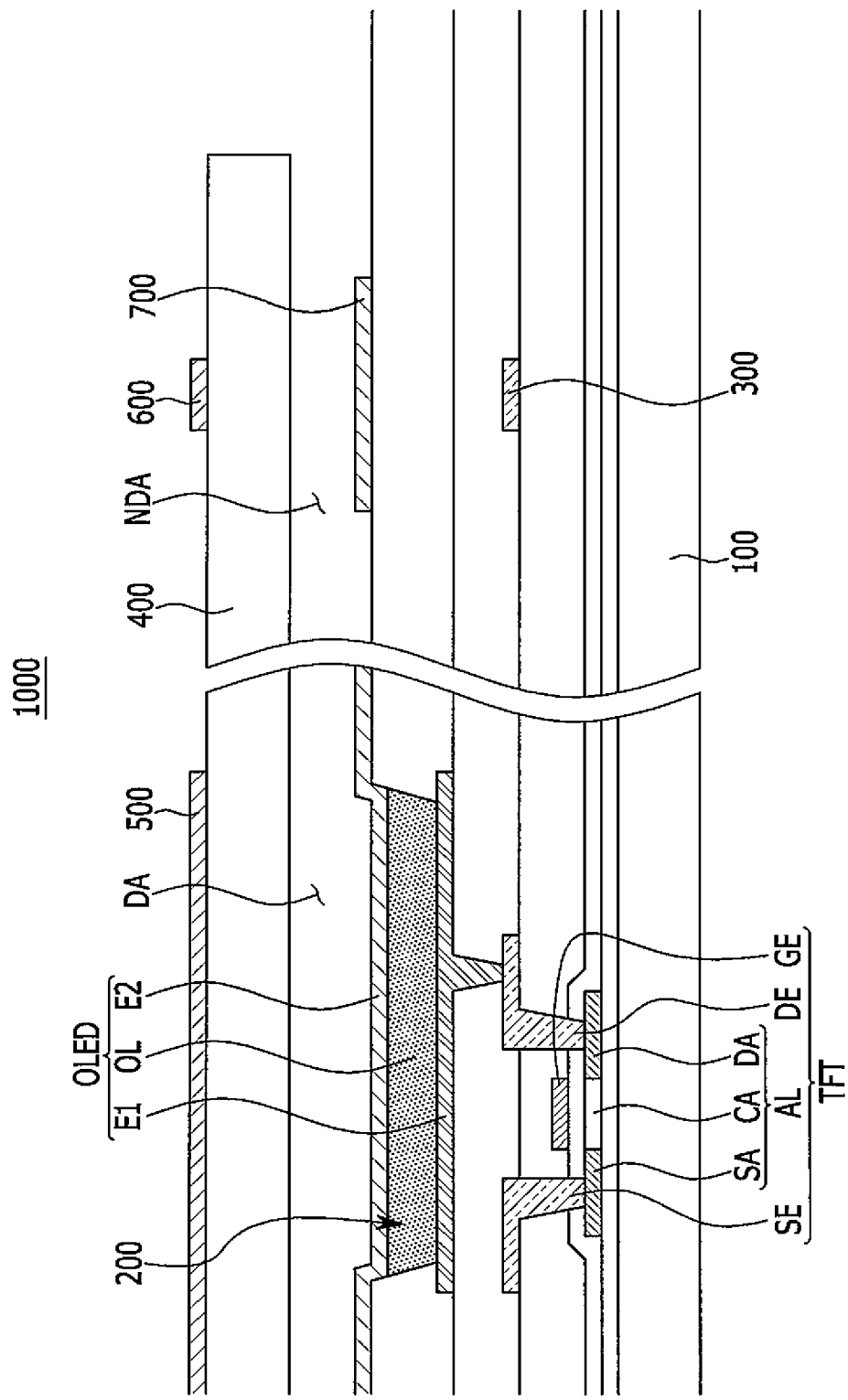
FIG. 4 is a cross-sectional view illustrating a display device according to another example embodiment of the present invention.

FIG. 4 is a cross-sectional view illustrating a display device according to another example embodiment of the present invention.

As illustrated in FIG. 4, an anti-noise electrode 700 of a display device 1000 according to another example embodiment of the present invention is positioned on the same layer as the second electrode E2, and formed of the same material or substantially the same material as that of the second electrode E2. That is, the anti-noise electrode 700 is formed concurrently (e.g., simultaneously) with the second electrode E2 to be spaced apart from the second electrode E2, and fixed power is applied to the anti-noise electrode 700 from the outside. The anti-noise electrode 700 has a larger width than that of the display wiring 300 and the touch wiring 600.

As described above, in the display device 1000 according to the example embodiments of the present invention, the anti-noise electrode 700 to which the fixed power is applied is positioned between the display wiring 300 and the touch wiring 600 corresponding to the non-display area NDA where the display wiring 300 and the touch wiring 600 overlap with (e.g., cross) each other. Thus, the anti-noise electrode 700 suppresses or reduces the undesired noise from being generated in each of the driving power through the display wiring 300, and the touch signal through the touch wiring 600. That is, the display device 1000 with significantly or substantially improved driving reliability is provided.

Further, in the display device 1000 according to one example embodiment of the present invention, the anti-noise electrode 700 is spaced apart from the second electrode E2 to be formed concurrently (e.g., simultaneously) with the second electrode E2, such that the anti-noise electrode 700 is additionally formed during the process of forming the second electrode E2, instead of an additional process. As a result, even though the display device 1000 includes the anti-noise electrode 700, the display device 1000, which suppresses additional manufacturing time and manufacturing cost from being generated, is provided.

Hereinafter, a display device according to another example embodiment of the present invention will be described with reference to FIG. 5.

Figure 5:
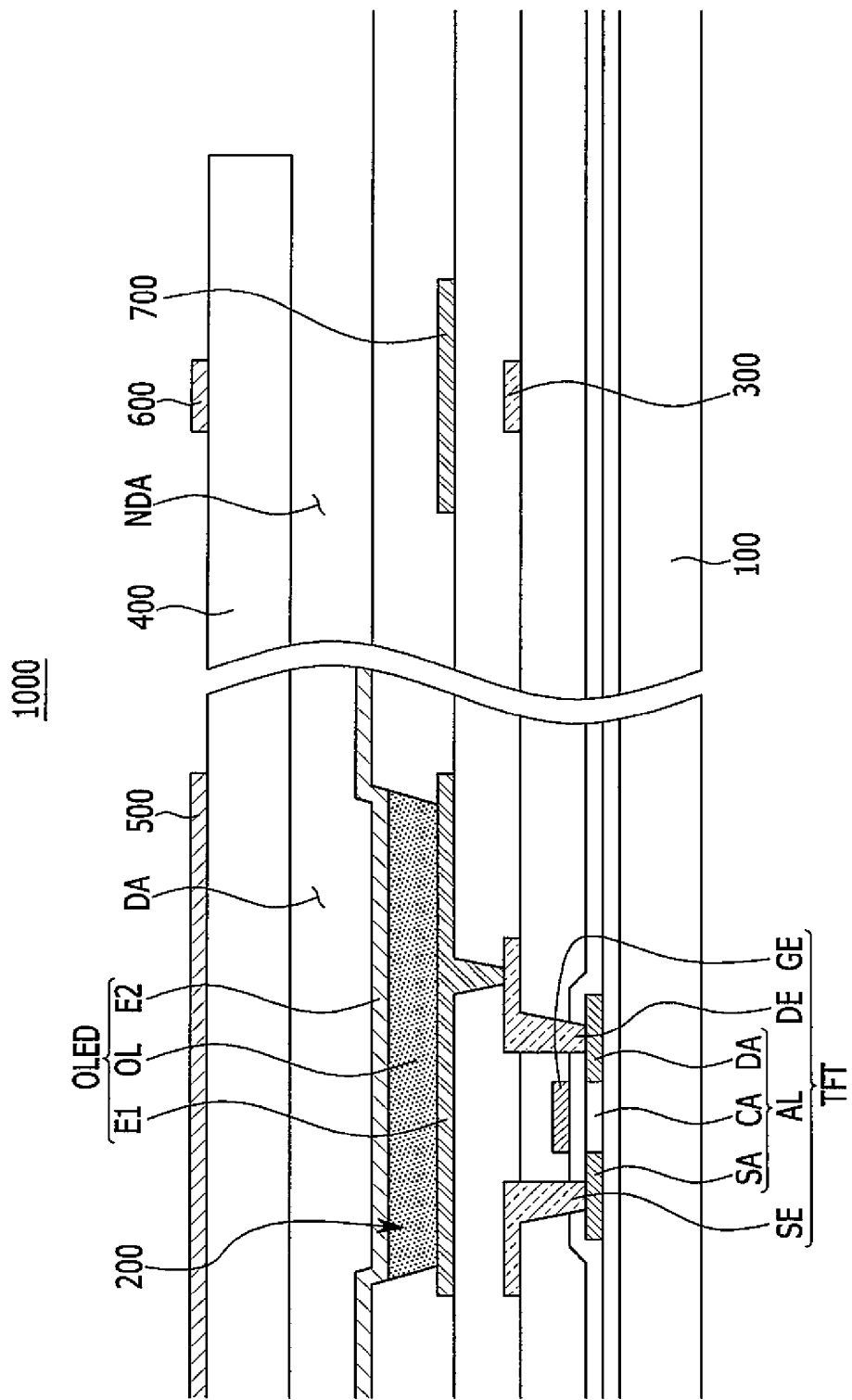
FIG. 5 is a cross-sectional view illustrating a display device according to another example embodiment of the present invention.

FIG. 5 is a cross-sectional view illustrating a display device according to another example embodiment of the present invention.

As illustrated in FIG. 5, an anti-noise electrode 700 of a display device 1000 according to another example embodiment of the present invention is positioned at the same layer as the first electrode E1 and is formed of the same material or substantially the same material as that of the first electrode E1. That is, the anti-noise electrode 700 is formed concurrently (e.g., simultaneously) with the first electrode E1 to be spaced apart from the first electrode E1, and the fixed power is applied to the anti-noise electrode 700 from the outside.

As described above, in the display device 1000 according to the example embodiments of the present invention, the anti-noise electrode 700 to which the fixed power is applied is positioned between the display wiring 300 and the touch wiring 600 corresponding to the non-display area NDA where the display wiring 300 and the touch wiring 600 overlap with (e.g., cross) each other. Thus, the anti-noise electrode 700 suppresses or reduces the undesired noise from being generated in each of the driving power through the display wiring 300, and the touch signal through the touch wiring 600. That is, the display device 1000 with substantially improved driving reliability is provided.

Further, in the display device 1000 according to one example embodiment of the present invention, the anti-noise electrode 700 is spaced apart from the first electrode E1 to be formed concurrently (e.g., simultaneously) with the first electrode E1, such that the anti-noise electrode 700 is additionally formed during the process of forming the first electrode E1, instead of an additional process. As a result, even though the display device 1000 includes the anti-noise electrode 700, the display device 1000, which suppresses additional manufacturing time and manufacturing cost from being generated, is provided.

Hereinafter, a display device according to another example embodiment of the present invention will be described with reference to FIG. 6.

Figure 6:
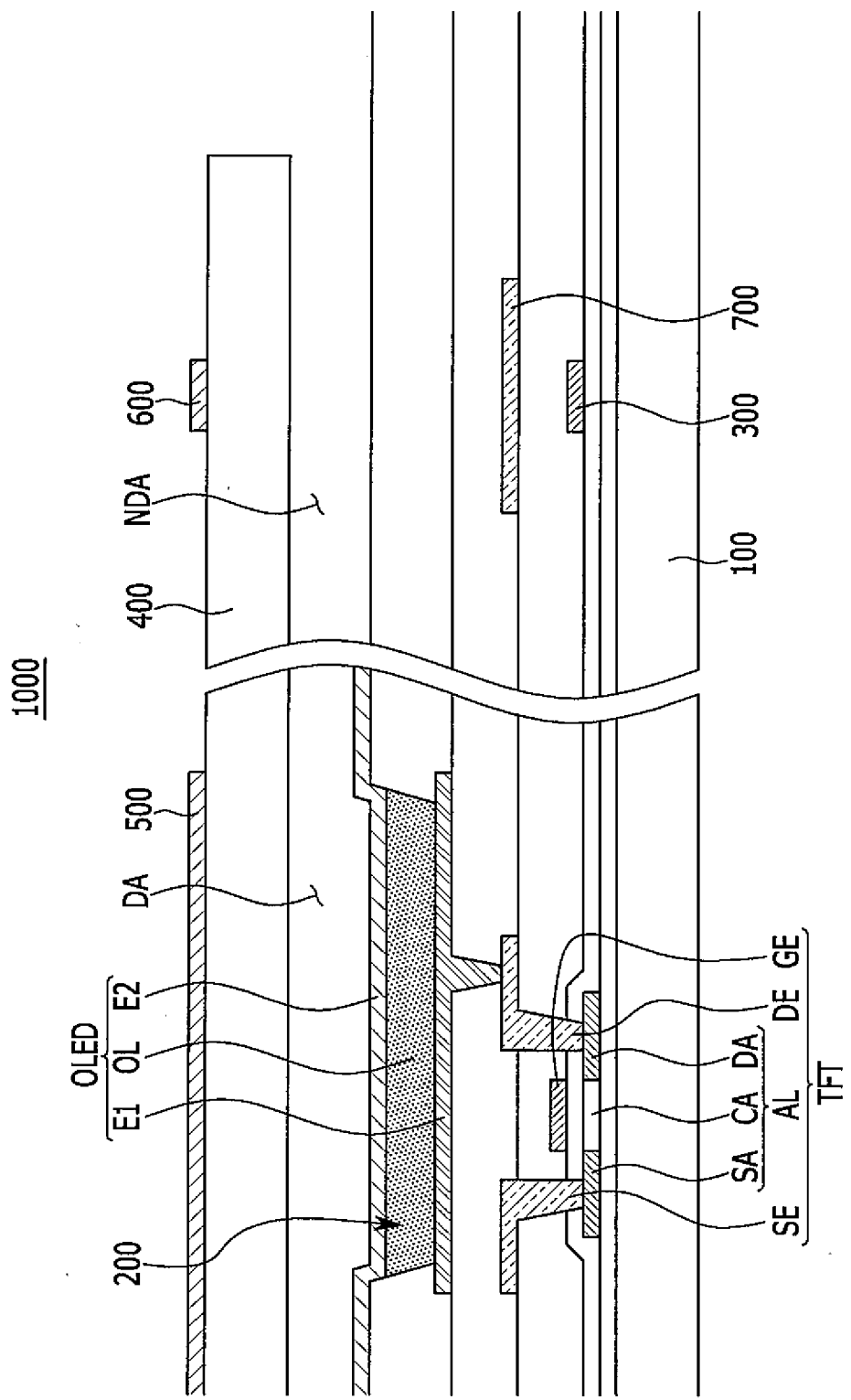
FIG. 6 is a cross-sectional view of a display device according to another example embodiment of the present invention.

FIG. 6 is a cross-sectional view of a display device according to another example embodiment of the present invention.

As illustrated in FIG. 6, the display wiring 300 of the display device 1000 according to another example embodiment of the present invention is positioned at the same layer as the gate electrode GE and is formed of the same material or substantially the same material as that of the gate electrode GE. Further, the display wiring 300 is formed concurrently (e.g., simultaneously) with the gate electrode GE.

The anti-noise electrode 700 is positioned at the same layer as the source and drain electrodes SE and DE and is formed of the same material or substantially the same material as that of the source and drain electrodes SE and DE. That is, the anti-noise electrode 700 is formed concurrently (e.g., simultaneously) with the source and drain electrodes SE and DE to be spaced apart from the source and drain electrodes SE and DE, and the fixed power is applied to the anti-noise electrode 700 from the outside.

As described above, in the display device 1000 according to example embodiments of the present invention, the anti-noise electrode 700 to which the fixed power is applied is positioned between the display wiring 300 and the touch wiring 600 corresponding to the non-display area NDA where the display wiring 300 and the touch wiring 600 overlap with (e.g., cross) each other. Thus, the anti-noise electrode 700 suppresses or reduces the undesired noise from being generated in each of the driving power through the display wiring 300, and the touch signal through the touch wiring 600. That is, the display device 1000 with significantly or substantially improved driving reliability is provided.

Further, in the display device 1000 according to one example embodiment of the present invention, the anti-noise electrode 700 is spaced apart from the source and drain electrodes SE and DE to be formed concurrently (e.g., simultaneously) with the source and drain electrodes SE and DE, such that the anti-noise electrode 700 is additionally formed during the process for forming the source and drain electrodes SE and DE, instead of an additional process. As a result, even though the display device 1000 includes the anti-noise electrode 700, the display device 1000, which suppresses additional manufacturing time and manufacturing cost from being generated, is provided.

While the present invention has been described in connection with what is presently considered to be practical example embodiments, it is to be understood by a person having ordinary skill in the art that the invention is not limited to the disclosed embodiments, but, on the contrary, is intended to cover various modifications and equivalent arrangements included within the spirit and scope of the appended claims, and their equivalents.

What is claimed is:

1. A display device, comprising:
    a first substrate comprising a display area and a non-display area adjacent to the display area;
    a display unit on the first substrate at the display area and configured to display an image, the display unit comprising an organic light emitting diode comprising:
        a first electrode on the first substrate;
        an organic emission layer on the first electrode; and
        a second electrode on the organic emission layer;
    a display wiring on the first substrate at the non-display area and coupled to the display unit;
    a second substrate on the first substrate with the display unit and the display wiring therebetween;
    a sealant between the first substrate and the second substrate to correspond to the non-display area;
    a touch unit on the second substrate, corresponding to the display unit, and configured to recognize a touch;
    a touch wiring on the second substrate at the non-display area and coupled to the touch unit; and
    an anti-noise electrode between the display wiring and the touch wiring at the non-display area, the anti-noise electrode overlapping with the display wiring and the touch wiring,
    wherein the anti-noise electrode is coupled to the second electrode through a connection portion contacting the sealant, and a width of the anti-noise electrode is larger than a width of the connection portion.

2. The display device of claim 1, wherein fixed power is applied to the anti-noise electrode.

3. The display device of claim 1, wherein the anti-noise electrode is at a same layer as the second electrode and is formed of a same material as that of the second electrode.

4. The display device of claim 3, wherein the second electrode comprises a light transmissive electrode.

5. The display device of claim 3, wherein the anti-noise electrode is coupled to the second electrode.

6. The display device of claim 5, wherein the anti-noise electrode is extended from the second electrode and is integral to the second electrode.

7. The display device of claim 3, wherein the anti-noise electrode is spaced from the second electrode.

8. The display device of claim 1, wherein the anti-noise electrode is spaced from the first electrode.

9. The display device of claim 1, wherein:
    the display unit further comprises a thin film transistor coupled to the organic light emitting diode, the thin film transistor comprising:
    an active layer on the first substrate;
    a gate electrode on the active layer; and
    source and drain electrodes on the gate electrode and coupled to the active layer.

10. The display device of claim 1, wherein the touch unit is a capacitive type touch unit.

11. The display device of claim 1, further comprising a driver on the first substrate corresponding to the non-display area and coupled to the display wiring.

12. A display device, comprising:
    a first substrate comprising a display area and a non-display area adjacent to the display area;
    a display unit on the first substrate at the display area and configured to display an image;
    a display wiring on the first substrate at the non-display area and coupled to the display unit;
    a second substrate on the first substrate with the display unit and the display wiring therebetween;
    a touch unit on the second substrate, corresponding to the display unit, and configured to recognize a touch;
    a touch wiring on the second substrate at the non-display area and coupled to the touch unit; and
    an anti-noise electrode between the display wiring and the touch wiring at the non-display area,
    wherein the display unit comprises:
        an organic light emitting diode comprising a first electrode on the first substrate;

an organic emission layer on the first electrode; and
a second electrode on the organic emission layer,
wherein the anti-noise electrode is at a same layer as the second electrode and is formed of a same material as that of the second electrode,
wherein the anti-noise electrode is coupled to the second electrode,
wherein the display device further comprises a sealant between the first substrate and the second substrate to correspond to the non-display area and configured to cover the display unit, and
wherein the anti-noise electrode comprises a connection portion coupled to the second electrode by contacting the sealant and having a smaller width than that of other portions of the anti-noise electrode.

* * * * *